(12) United States Patent
Doniger (10) Patent No.: US 7,234,122 B2
(45) Date of Patent: *Jun. 19, 2007

(54) THREE-DIMENSIONAL INTERCONNECT RESISTANCE EXTRACTION USING VARIATIONAL METHOD

(75) Inventor: Kenneth Doniger, Menlo Park, CA (US)

(73) Assignee: LSI Corporation, Milpitas, CA (US)

( * ) Notice: Subject to any disclaimer, the term of this patent is extended or adjusted under 35 U.S.C. 154(b) by 184 days.

This patent is subject to a terminal disclaimer.

(21) Appl. No.: 11/032,720

(22) Filed: Jan. 10, 2005

(65) Prior Publication Data

US 2005/0235235 A1 Oct. 20, 2005

Related U.S. Application Data

(60) Provisional application No. 60/563,595, filed on Apr. 19, 2004.

(51) Int. Cl.
*G06F 17/50* (2006.01)

(52) U.S. Cl. .................................. 716/5; 716/7; 703/2

(58) Field of Classification Search ................... 716/5, 716/7; 703/1, 2
See application file for complete search history.

(56) References Cited

U.S. PATENT DOCUMENTS

| | | | | |
|---|---|---|---|---|
| 4,821,164 | A * | 4/1989 | Swanson | 702/5 |
| 6,256,599 | B1 * | 7/2001 | Tiribuzi | 703/2 |
| 6,627,950 | B1 * | 9/2003 | Bulucea et al. | 257/329 |
| 6,802,047 | B1 * | 10/2004 | Doniger | 716/5 |
| 2003/0011039 | A1 * | 1/2003 | Ahlers et al. | 257/493 |
| 2005/0107992 | A1 * | 5/2005 | Kase et al. | 703/2 |
| 2005/0114812 | A1 * | 5/2005 | Kok | 716/7 |

OTHER PUBLICATIONS

P.M. Hall, "Resistance Calculations for Thin Film Patterns", Bell Telephone Laboratories, Inc., Aug. 24, 1967, pp. 277-295.
Robert Weinstock, "Calculus of variations With Applications to Physics and Engineering" Chapter 12, Electrostatics, 1952, pp. 294-311.
T.A. Schreyer et al., "A Two-Dimensional Analytical Model of the Cross-Bridge Kelvin Resistor", IEEE, Dec. 1986, pp. 661-663.
E. Butkov, "Mathematical Physics", Jan. 1, 1968, pp. 562-563, Addison-Wesley Publishing Company.
J. Nocedal et al., "Numerical Optimization", 1999, pp. 442-487, Springer-Verlag New York, Inc.

* cited by examiner

*Primary Examiner*—Phallaka Kik
(74) *Attorney, Agent, or Firm*—Thelen Reid Brown; Raysman & Steiner LLP (57) ABSTRACT

A method and apparatus calculate resistance of a three-dimensional conductor system defined by boundary faces. The resistance calculation includes (a) partitioning the three-dimensional shape into a plurality of parallelepipeds, a boundary between two parallelepipeds forms and entire face for both of the two parallelepipeds, (b) determining at least one source face and at least one sink face from among the boundary faces, a current entering the conductor system through the source face and leaving the conductor system through the sink face, (c) setting boundary conditions with respect to the current for each of the parallelepipeds, (d) calculating power for each of the parallelepipeds with the boundary conditions, (e) calculating power for the conductor system based on the power and the boundary conditions of each of the parallelepipeds, and (f) obtaining the resistance of the conductor system by minimizing dissipation of the calculated power of the conductor system.

23 Claims, 8 Drawing Sheets

THREE-DIMENSIONAL INTERCONNECT RESISTANCE EXTRACTION USING VARIATIONAL METHOD

CROSS REFERENCE TO RELATED APPLICATIONS OR PRIORITY CLAIM

This application claims the benefit of provisional U.S. Patent Application Ser. No. 60/563,595 filed on Apr. 19, 2004 in the name of the same inventor. This application is also related to U.S. patent application Ser. No. 10/224,019, entitled "Calculating Resistance of Conductor Layer for Integrated Circuit Design," filed on Aug. 19, 2002, in the name of the same inventor and commonly assigned to the same assignee, which is now U.S. Pat. No. 6,802,047 issued on Oct. 5, 2004.

FIELD OF THE INVENTION

The present invention relates to circuit extraction in integral circuit (IC) design processes. More particularly, the present invention relates to a method and apparatus for calculating resistance of a three-dimensional conductor system in an IC design.

BACKGROUND OF THE INVENTION

Figure 1A:
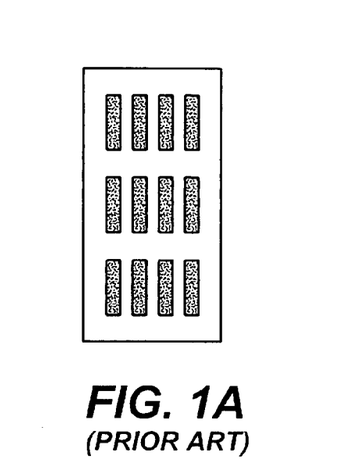
FIGS. 1A–1C are diagrams schematically illustrating examples of a conductor layer.

As complexity and performance of IC and Very Large Scale Integration (VLSI) circuit increases, time delay due to interconnects is becoming as significant as that of logic gates. Interconnect resistance (or wire resistance) is one of the important parameters for such a time delay calculation and other circuit characterization. The adoption of Chemical Mechanical Polishing (CMP) makes interconnect thickness sensitive to the local metal density. This leads to design limits on the metal density, and the introduction of nonmetal slots in large metal structures, such as wide metal lines as shown in FIG. 1A. The resistance of these complicated structures is difficult to calculate.

Interconnects are typically formed with a thin-film, i.e., a two-dimensional metal or conductor layer. Thus, interconnect resistance is typically calculated using the sheet resistance $R_s$, which is measured in Ohms per square ($\Omega/\square$). The sheet resistance $R_s$ takes the material properties and thickness into account, and the resistance of a square unit of material is the same for a square of any size. Thus, the resistance of a conductor layer is calculated as the product of the sheet resistance $R_s$ and the number of squares S. However, there are no formulas for the number of squares S except for conductor layers having the simplest geometry such as a rectangle.

Figure 1B:
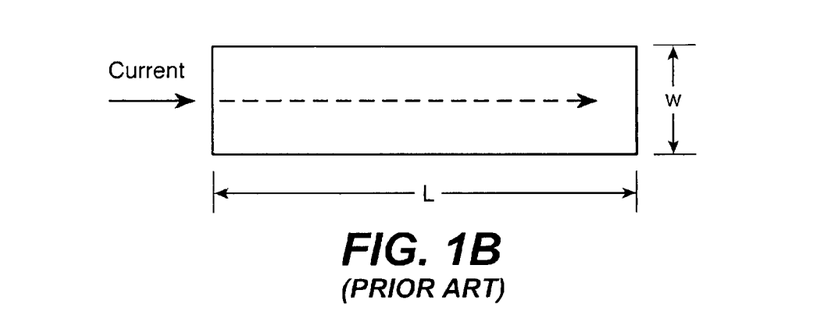
Figure 1C:
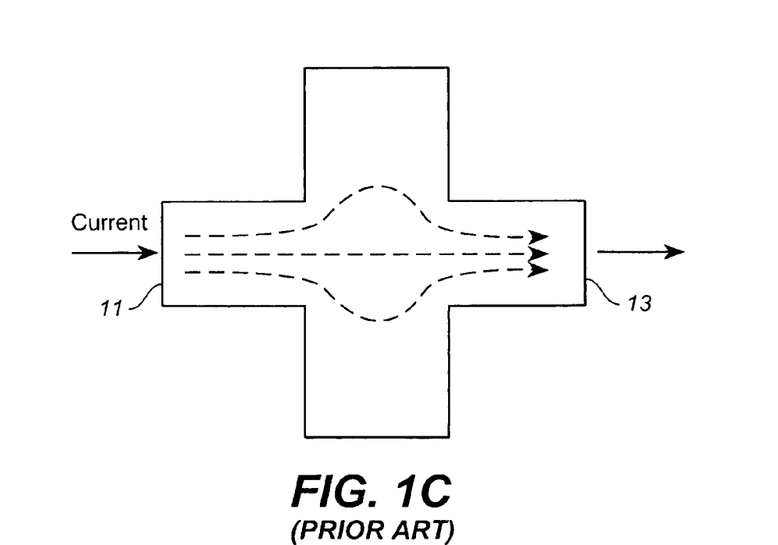

FIG. 1B schematically illustrates a simple rectangular conductor having a length L and a width w. The current flows through the length L from one end to the other, perpendicular to the width w. In this case, the number of squares S is given as S=L/w. However, conductor shapes can be more complicated, for example, as shown in FIG. 1C. Suppose that the current enter the conductor from one edge 11 to another edge 13, current paths need not be straight. This makes it difficult to define a length and a width of the conductor shape, and renders the resistance calculation inaccurate.

The importance of parasitic capacitance due to interconnects has been recognized to the extent that a number of efficient and specialized capacitance solvers exist. However, this is not the case for interconnect resistance. Conventionally, a resistance calculation must use a general field solver, such as Raphael, available from Synopsys Corporation, Mountain View, Calif., which uses finite element, finite difference, or boundary element analysis.

Conformal transformations can be used to calculate the resistance of some two-dimensional (thin film) structures. For example, Hall, P. M., "Resistance Calculations For Thin Film Patterns", Thin Solid Films, 1, 1967–68, pp. 277–295 describes such conformal transformations. When this approach is feasible, it can be accurate and very fast. However, conformal transformations generally assume specific constant potential surfaces, which might not conform to the specific system at hand. Moreover, this technique does not extend to three dimensions.

Accordingly, the present invention provides a fast and accurate interconnect resistance solver which uses a variational method and is capable of extending to three-dimensional calculations.

BRIEF DESCRIPTION OF THE INVENTION

A method and apparatus calculate resistance of a conductor system for an integrated circuit design, the conductor system having a three-dimensional shape defined by boundary faces. The resistance calculation includes (a) partitioning the three-dimensional shape into a plurality of parallelepipeds, a boundary between two parallelepipeds forms an entire face for both of the two parallelepipeds, (b) determining at least one source face and at least one sink face from among the boundary faces, a current entering the conductor system through the source face and leaving the conductor system through the sink face, (c) setting boundary conditions with respect to the current for each of the parallelepipeds, (d) calculating power for each of the parallelepipeds with the boundary conditions, (e) calculating power for the conductor system based on the power and the boundary conditions of each of the parallelepipeds, and (f) obtaining the resistance of the conductor system by minimizing dissipation of the calculated power of the conductor system.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a three-dimensional interconnect resistance calculation using a variation al method. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, the components, process steps, and/or data structures may be implemented using various types of operating systems (OS), computing platforms, firmware, computer programs, computer languages, and/or general-purpose machines. The method can be run as a programmed process running on processing circuitry. The processing circuitry can take the form of numerous combinations of processors and operating systems, or on a stand-alone device. The process can be implemented as instructions executed by such hardware, hardware alone, or any combination thereof. The software may be stored on a program storage device readable by a machine.

In accordance with one embodiment of the present invention, the method may be implemented on a data processing computer such as a personal computer, workstation computer, mainframe computer, or high performance server running an OS such as Solaris® available from Sun Microsystems, Inc. of Palo Alto, Calif., Microsoft® Windows® XP and Windows® 2000, available form Microsoft Corporation of Redmond, Wash., or various versions of the Unix operating system such as Linux available from a number of vendors. The method may also be implemented on a multiple processor system, or in a computing environment including various peripherals such as input devices, output devices, displays, pointing devices, memories, storage devices, media interfaces for transferring data to and from the processor(s), and the like, all as well known to those of ordinary skill in the art. In addition, such a computer system or computing environment may be networked locally, or over the Internet.

Figure 2:
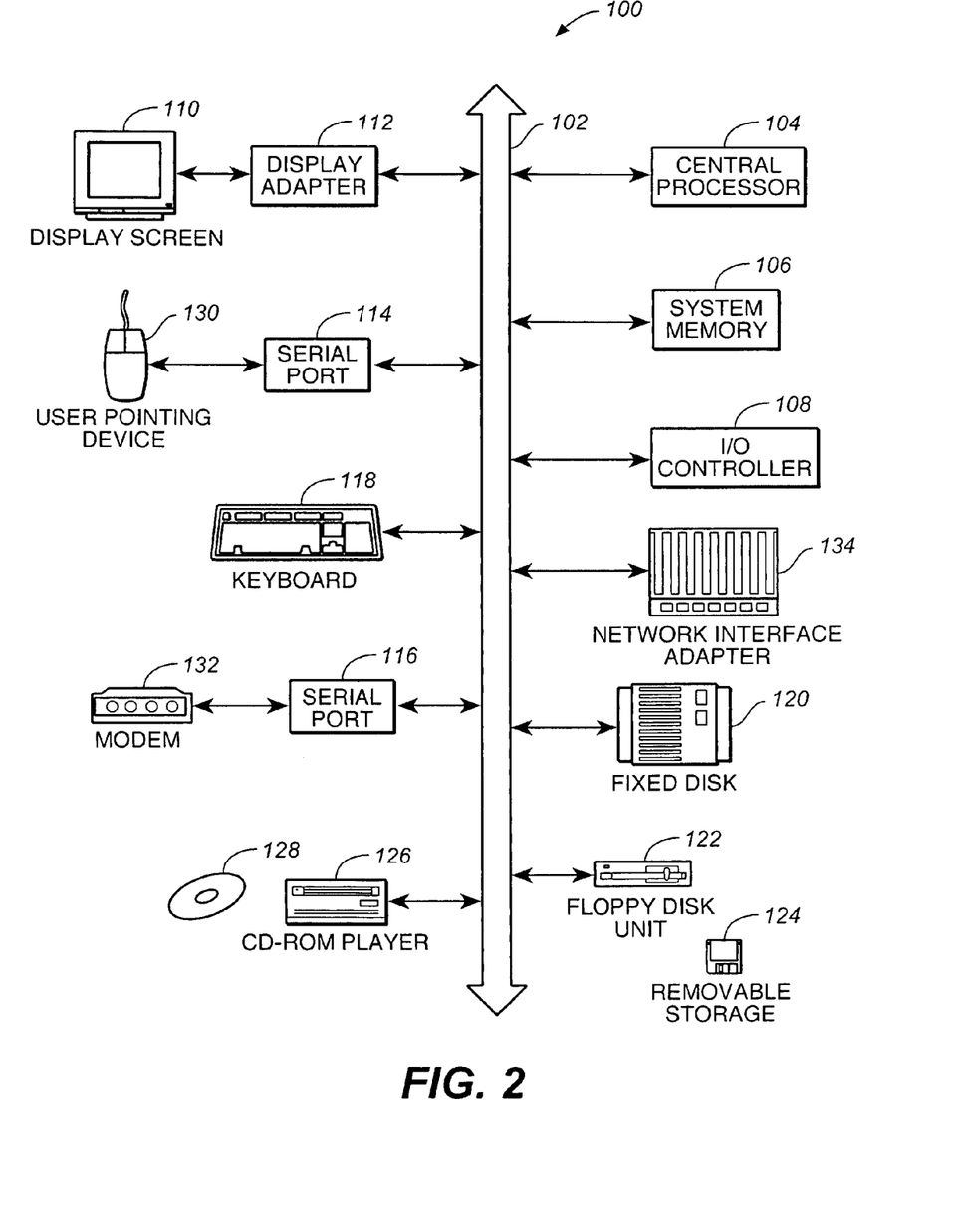
FIG. 2 is a block diagram schematically illustrating a computer system suitable for implementing aspects of the present invention.

FIG. 2 depicts a block diagram of a computer system 100 suitable for implementing aspects of the present invention. As shown in FIG. 2, computer system 100 includes a bus 102 which interconnects major subsystems such as a central processor 104, a system memory 106 (typically RAM), an input/output (I/O) controller 108, an external device such as a display screen 110 via display adapter 112, serial ports 114 and 116, a keyboard 118, a fixed disk drive 120, a floppy disk drive 122 operative to receive a floppy disk 124, and a CD-ROM player 126 operative to receive a CD-ROM 128. Many other devices can be connected, such as a pointing device 130 (e.g., a mouse) connected via serial port 114 and a modem 132 connected via serial port 116. Modem 132 may provide a direct connection to a remote server via a telephone link or to the Internet via a POP (point of presence). Alternatively, a network interface adapter 134 may be used to interface to a local or wide area network using any network interface system known to those skilled in the art (e.g., Ethernet, xDSL, AppleTalk™).

Many other devices or subsystems (not shown) may be connected in a similar manner. Also, it is not necessary for all of the devices shown in FIG. 2 to be present to practice the present invention, as discussed below. Furthermore, the devices and subsystems may be interconnected in different ways from that shown in FIG. 2. The operation of a computer system such as that shown in FIG. 2 is readily known in the art and is not discussed in detail in this application, so as not to overcomplicate the present discussion. Code to implement the present invention may be operably disposed in system memory 106 or stored on storage media such as fixed disk 120, floppy disk 124 or CD-ROM 128.

In general, the variational techniques attempt to find an approximate solution to a problem by finding a global quantity that takes on an extreme (maximum or minimum) value. For example, Fermat found that light takes the path from point A to point B that minimizes the total travel time. An expression for this global quantity is written in terms of a sum of basis functions with unknown coefficients. These basis functions satisfy all stated boundary conditions and might have other desirable properties. Traditionally, these functions have been polynomials. In particular, it is advantageous to choose functions that resemble the actual solution. This way, using only a few terms will yield a fairly accurate solution. This expression is then minimized (or maximized), and the desired quantity is calculated from the result.

Variational methods have several desirable qualities as follows:
  (i) They are very efficient because, unlike traditional methods, they do not solve for quantities at many points in the system. There is no grid. These point quantities are usually discarded when the result is calculated. Instead, a global quantity is used to find the global quantity of interest.
  (ii) A numerical "guess" which is only first order accurate leads to a result that is second order accurate.
  (iii) They always lead to upper or lower bounds on the actual solution.

The variational principle used in the present invention is that the power dissipated by the system is a minimum. In accordance with one embodiment of the present invention, a specific variational method is developed and implemented to solve the minimum power. The variational method in accordance with one embodiment of the present invention is applied to conductor systems with rectilinear boundaries. Since these are prevalent in VLSI interconnect design, this would not constitute a serious limitation. Unlike conformal transformations, the variational method is also extended to three dimensions.

A static distribution of currents in a conductor of uniform conductivity, $\sigma$, obeys Ohm's Law, $J=\sigma E$, where J denotes current density and E denotes the electric field. The static nature of the system allows us to replace the electric field with the negative gradient of the electric potential, $\Phi$:

$$J = -\sigma \nabla \Phi \quad (1)$$

In addition, charge does not accumulate anywhere in a time invariant system, therefore $\sigma \cdot J = 0$. This is true locally, and in the system as a whole. Taking the divergence of both sides of Equation (1) yields Laplace's equation: $\sigma^2 \Phi = 0$. Solving Laplace's equation is equivalent to minimizing the integral:

$$P = \sigma \int_V (\nabla \Phi) \cdot (\nabla \Phi) dV, \quad (2)$$

where the integral is taken over the volume, V, of the system. The right side of Equation (2) has been multiplied by $\sigma$ to make the expression equal to the dissipated power, P. Once the minimum P has been calculated, the resistance, R, can be found from $R = P/I^2$, where I is the total current flowing through the system, which, because the current has no divergence, is equal to the total current entering or leaving the system.

The variational approximation to the power will always be larger than the actual power. Thus, the solution for R is an upper bound, and expressed as:

$$R = \frac{\sigma \int_V |\nabla \Phi|^2 dV}{I^2}. \quad (3)$$

Thus, the resistance of the system is obtained from the power divided by the square of the total current.

Although it is not possible to write an exact expression for $\Phi$ for any geometry more complicated than a rectangle, it is possible to decompose more complicated systems into rectangular regions of uniform conductivity. Any three-dimensional shape can also be partitioned into a plurality of parallelepipeds which consists of six two-dimensional faces. The potential $\Phi$ in a single rectangle can be written as a combination of polynomials and rectangular harmonics, all of which satisfy Laplace's equation in a rectangle, and the boundary conditions.

Figure 3:
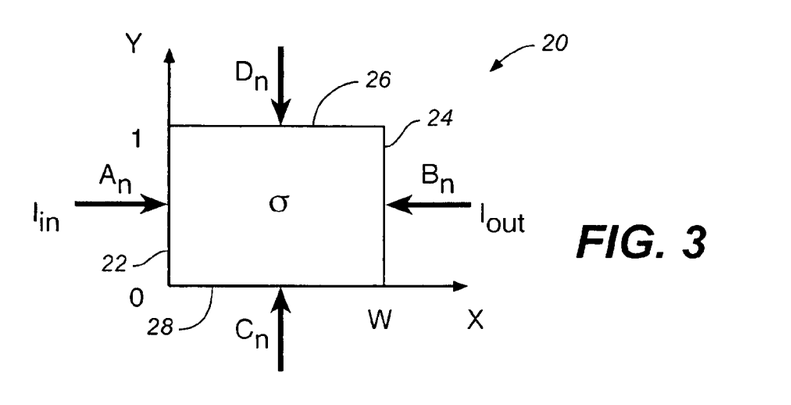
FIG. 3 is a diagram schematically illustrating a conductor system (parallelepiped) of width w, length l, height h (not shown) and conductivity σ.

FIG. 3 schematically illustrates a conductor system (parallelepiped) 20 of width w, length l, height h (not shown) and conductivity $\sigma$. The Fourier coefficients associated with the boundary currents on each side are $A_n$, $B_n$, $C_n$, and $D_n$. Arrows show the positive current directions. In a thin film system (two-dimensional), the parallelepiped 20 is simplified into a rectangular region of extent (width) w in the x direction, extent (length) l in y direction, and extent (height) h in z direction, where there is no z dependence. Since currents rather than voltages, are dealt with here, the boundary conditions involve gradients of potential perpendicular to the boundaries, i.e., Neumann boundary conditions. In the following, a two-dimensional embodiment is first described for simplicity, then expanded to a three-dimensional embodiment.

The expression for the electric potential $\Phi$ is given as follows:

$$\Phi(x,y) = F(x,y) + \frac{1}{\sigma h l} \sum_{n=1}^{N} A_n \frac{\cosh(\beta_n w - \beta_n x)}{\beta_n \sinh(\beta_n w)} \cos(\beta_n y) + \quad (4)$$

$$\frac{1}{\sigma h l} \sum_{n=1}^{N} B_n \frac{\cosh(\beta_n x)}{\beta_n \sinh(\beta_n w)} \cos(\beta_n y) +$$

$$\frac{1}{\sigma h w} \sum_{n=1}^{N} C_n \frac{\cosh(\alpha_n l - \alpha_n y)}{\alpha_n \sinh(\alpha_n l)} \cos(\alpha_n x) +$$

$$\frac{1}{\sigma h w} \sum_{n=1}^{N} D_n \frac{\cosh(\alpha_n y)}{\alpha_n \sinh(\alpha_n l)} \cos(\alpha_n x),$$

where $\alpha_n = n\pi/w$, $\beta_n = n\pi/l$, and F(x,y) is a function to be determined later, and the four summations are Fourier series. The equality sign in Equation (4) is strictly true only as $N \to \infty$. As N increases, the approximation becomes more accurate. The Fourier series terms are written in this way so that coefficients $A_n$, $B_n$, $C_n$, and $D_n$, will have units of current, and so that only one series will appear on each boundary when the current density perpendicular to that boundary is calculated.

For example, $J_x$ on the x=0 boundary is give as:

$$J_x(0,y) = -\sigma \frac{\partial F(x,y)}{\partial x}\bigg|_{x=0} + \frac{1}{hl} \sum_{n=1}^{N} A_n \cos(\beta_n y). \quad (5)$$

The series associated with each boundary are shown in FIG. 3.

The Fourier series in Equation (4) are not complete because the summations start at n=1 instead of n=0. The DC Fourier term has problems because $\alpha_n$ and $\beta_n$ appear in the expressions for the potential and the power, and are both zero when n=0. The n>0 terms average to zero across the boundaries. This means that there can be no net current across the boundary due to the Fourier terms. The net current must be produced by F(x,y). At the x=0 and x=w boundaries, $$-\sigma \frac{\partial F}{\partial x}\bigg|_{x=0} = \frac{A_0}{hl}, \quad -\sigma \frac{\partial F}{\partial x}\bigg|_{x=w} = -\frac{B_0}{hl}, \tag{6}$$

where we have introduced $A_0$ and $B_0$ in such a way as to complete the Fourier series on the boundaries. There are similar expressions for the y boundaries. It should be noted that current is defined to be positive entering the rectangle (FIG. 3).

From Equation (6), the form of F(x,y) is found to be $$F(x, y) = \frac{1}{2\sigma w l h}[A_0(w-x)^2 + B_0 x^2] + \frac{1}{2\sigma w l h}[C_0(l-y)^2 + D_0 y^2]. \tag{7}$$

Insertion of F(x,y) into Laplace's equation yields $$\nabla^2 F(x,y) = A_0 + B_0 + C_0 + D_0. \tag{8}$$

This satisfies Laplace's equation because the right side of Equation (8) is the total net current entering the region. This must be zero because the divergence of the current is zero. The expression for F completes the Fourier series on the boundaries. Now, the potential Φ can approximate any current density distribution on the boundary. In particular, it can approximate the actual current density. As was mentioned previously, the approximation improves as the number of terms in the Fourier series (N+1) increases.

The sheet resistance is defined as $$R_s = \frac{1}{\sigma h}$$

in Ohms/□. Substitution of Equations (4) and (5) into equation (2) yields $$P = \frac{R_s w}{3l}(A_0^2 - A_0 B_0 + B_0^2) + \frac{R_s l}{3w}(C_0^2 - C_0 D_0 + D_0^2) + \tag{9}$$

$$\frac{2R_s w}{\pi^2 l} \sum_{n=1}^{N} \frac{C_n + D_n}{n^2}[A_0 + (-1)^n B_0] +$$

$$\frac{2R_s l}{\pi^2 w} \sum_{n=1}^{N} \frac{A_n + B_n}{n^2}[C_0 + (-1)^n D_0] +$$

$$\frac{R_s}{2\pi} \sum_{n=1}^{N} \frac{1}{n}\left[\frac{A_n^2 + B_n^2}{\tanh(\beta_n w)} + \frac{2A_n B_n}{\sinh(\beta_n w)}\right] +$$

$$\frac{R_s}{2\pi} \sum_{n=1}^{N} \frac{1}{n}\left[\frac{C_n^2 + D_n^2}{\tanh(\alpha_n l)} + \frac{2C_n D_n}{\sinh(\alpha_n l)}\right] +$$

$$\frac{2R_s}{\pi^2} \sum_{m=1}^{N} \sum_{n=1}^{N} \frac{[A_m + (-1)^n B_m][C_n + (-1)^m D_n]}{n^2 l/w + m^2 w/l}.$$

Although Equation (9) yields the form of the solution, the Fourier coefficients are not known because the boundary conditions are not known. Because all of the terms in Equation (9) are quadratic in the Fourier coefficients, Equation (9) can be written in matrix notation as:

$$P = x^T \cdot H \cdot x \tag{10}$$

where $x_T = [A_1 \ldots A_N, B_1 \ldots B_N, C_1 \ldots C_N, D_1 \ldots D_N]$ is the vector of unknown Fourier coefficients, and H is a symmetric, positive definite matrix that consists of 16 N-by-N blocks, which can be written symbolically as:

$$H = \begin{bmatrix} A_m A_n & A_m B_n & A_m C_n & A_m D_n \\ B_m A_n & B_m B_n & B_m C_n & B_m D_n \\ C_m A_n & C_m B_n & C_m C_n & C_m D_n \\ D_m A_n & D_m B_n & D_m C_n & D_m D_n \end{bmatrix}.$$

The notation used for each block element symbolizes the coefficients that multiply the unknown Fourier coefficients. In each block, m denotes the row and n the column. For example, from the last term in Equation (9), an element in the $A_m C_n$ block is $$\frac{R_s}{\pi^2} \frac{1}{n^2 l/w + m^2 w/l}.$$

It should be noted that equations (9) and (10) are for a single region. Each region in a multi-region system will have its own x and H.

When power is minimized, it is the power of the entire system, not each region individually. The regional H matrices are combined together to form a matrix K. Since there are no terms that feature cross products of unknowns from different regions, K is block diagonal. In the same spirit, y is defined as the concatenation of the x vectors from all of the regions. Thus, $$P = y^T \cdot K \cdot y \tag{11}$$

Figure 4A:
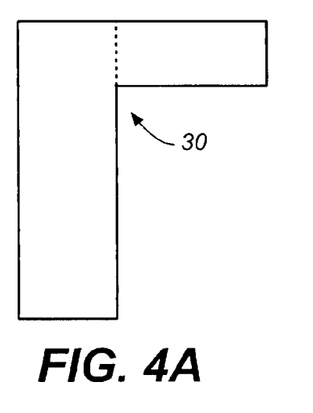
FIGS. 4A–4B are diagrams schematically illustrating an example of a set of undesirable boundaries and a set of desirable boundaries in an elbow-shaped conductor system.
Figure 4B:
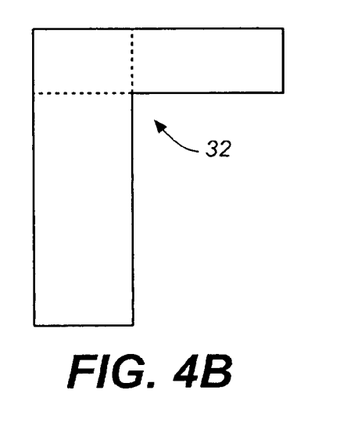

In a system composed of rectangular regions, all region boundaries are either on the edge of the system with no region on the other side, or are internal to the system and are shared by two regions. All constraints apply continuity to the current densities crossing region boundaries, or involve ∇·J=0 in some way. The boundaries themselves are of a special sort. Any boundary between two regions (an "internal" boundary) consists of the entire side of both regions. FIGS. 4A and 4B schematically illustrate an example of a set of undesirable boundaries 30 and a set of desirable boundaries 32 in an elbow-shaped conductor system. The restriction to this desirable type of boundary has the disadvantage that there are more regions than the minimum required to partition the system into rectangles. This increases the computational labor. The advantages are that the equations of constraint become very simple, and that the aspect ratio of the rectangular region does not affect the accuracy of the solution.

The constraint types are as follows:
  (i) The total current entering into the system through one or more edge boundaries is I. Zero current divergence demands that the total current flowing though the system is also I, and the total current leaving the system is −I. For convenience, the current is set as I=1. From the previous discussion, it should be noted that the net input and output currents are carried only by the zeroth harmonics, therefore this constraint applies only to the zeroth harmonics.

(ii) If there is an edge boundary with no associated input or output current, then no current crosses that boundary. All of the corresponding Fourier coefficients are zero. This makes N+1 constraints per edge boundary.

(iii) The net current entering any region must be zero, as in Equation (8). There is one of these constraints per region, and it involves only the zeroth harmonics.

(iv) Current density must be continuous across internal boundaries. The orthogonality of cosines and the restricted form of the region boundaries ensures that the individual harmonic coefficients match across the boundary separately. For example, if there is a region 1 on the left adjoining a region 2 on the right, then $$[B_n]_{region1} + [A_n]_{region2} = 0. \tag{12}$$

This yields N+1 constraints per internal boundary.

All constraints are linear in the unknown Fourier coefficients and so can be collected and written in matrix form as:

$$G \cdot y = b. \tag{13}$$

The matrix G has the same number of columns as there are unknowns in the entire system, and each row is a single equation of constraint. There are not as many constraints as there are unknowns, so matrix G has more columns than rows. Most constraints are homogeneous in form as shown in (12).

The right-side vector, b, has nonzero elements only for the input and output current constraints, where it is equal to the total current entering and leaving the system. Thus, there are only two nonzero elements in b. It turns out that the set of constraints on the zero-th harmonics in the system are linearly dependent. This situation can be corrected by discarding the equation of constraint on the output current. Then, vector b now has only a single nonzero element, which we can set to unity.

As a first example of the use of the method, let us consider a system that consists of a single rectangle 20 (without height dependency) as shown in FIG. 3. Only the zero-th harmonic is used. Suppose the current $I_{in}$ enters from the left side 22 and exits on the right side 24. The net current is unity, as discussed above, so power and resistance are numerically equal. The top and bottom boundaries 26 and 28 are system edges with no associated currents. Output current $I_{out}$ is negative. The sum of $A_0$, $B_0$, $C_0$, and $D_0$ is zero. Thus, $A_0 = 1$, $B_0 = -1$, $C_0 = 0$, and $D_0 = 0$. Substitution of this into Equation (9) yields $$R = R_s \frac{w}{l}.$$

This is an exact solution, which is encouraging for this simplest of all cases. Now suppose the current enters from the left side 22, turns 90°, and exits through the top 26. Now, $A_0 = 1$, $B_0 = 0$, $C_0 = 0$, and $D_0 = -1$. Substitution of this into Equation (9) yields $$R = R_s \frac{w}{3l} + R_s \frac{l}{3w}.$$

It is known that if w=l and if the input and output current densities are uniform, then $R \approx 0.56 R_s$. The above expression yields $0.67 R_s$, which is not bad for a zero-th order approximation. The use of only the lowest harmonic is a special case, in that there are sufficient constraints to solve the system without having to resort to any minimization procedure. The inclusion of additional harmonics will produce more accurate results, for example, if the first-order corrections are included, the value decreases to $0.60 R_s$, closer to the exact value. However, this requires the application of the variational method.

As described above, in order to calculate the resistance, the power expressed in Equation (11) is minimized, subject to the constraints expressed in Equation (13) as restated below, where y is the concatenation of the x vectors from all of the regions, and K is the combined matrix for all of the regions, as defined above.

$$P = y^T \cdot K \cdot y \tag{11}$$

$$G \cdot y = b \tag{13}$$

This form is a standard problem in optimization referred to as "quadratic programming problem with linear equality constraints," and there is an explicit solution. Since matrix K is positive definite, this is a convex problem, and it is guaranteed that there is one and only one solution. This is a great comfort because it is not necessary to find the global minimum amongst local minima.

Elimination of the vector of unknowns, y, yields $$P = b^T [GK^{-1}G^T]^{-1} b \tag{14}$$

for the minimum power. The unknowns have vanished from Equation (14) and need not to be solved here. This is because the value of the minimum power is of interest, not the combination of currents (Fourier coefficients) that produce the minimum value.

At first glance, calculating Equation (14) does not look very efficient, since there are two matrix inversions to perform, each scaling as $O(N^3)$, where N is the size of matrix K. However, matrix K has additional structure that makes it more efficient to manipulate the equation. As mentioned previously, matrix K is block diagonal, and each regional block, H, can be inverted individually. These features are utilized to obtain numerical results in the variational method. Within each H, there are diagonal sub-blocks that enable the use of inversion techniques with scaling properties more efficient than $O(N^3)$. In addition, matrix G is sparse, and the triple product in square brackets in Equation (14) is symmetric and positive definite. This allows the use of the preconditioned conjugate gradient (PCG) method to evaluate the second inversion.

Figure 5:
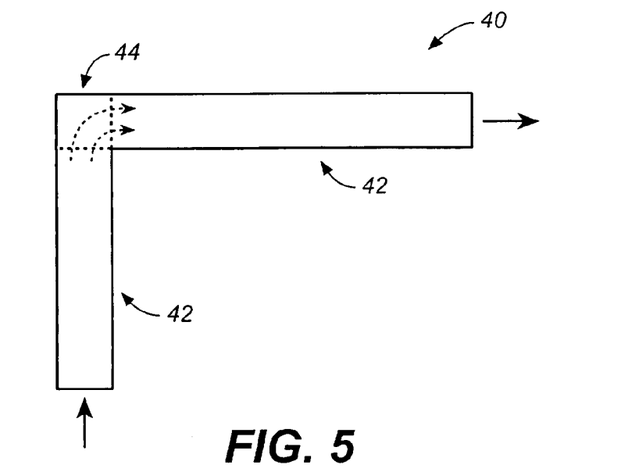
FIG. 5 is a diagram schematically illustrating a conductor layer of a simple elbow shape.

As a second example of the variational method in accordance with one embodiment of the present invention, the first example (rectangular) is extended to an elbow-shaped conductor system. FIG. 5 schematically illustrates a conductor layer 40 of a simple elbow shape. The number of squares in each arm 42 is the length of the arm 42 divided by its width. At the joint portion ("hinge") 44, the current turns 90°, but the length of the current path and the effective width are hard to define in the hinge 44. Suppose that the widths of the two arms 42 are identical so the hinge 44 is a square. In addition, the sheet resistance is set as $R_s = 1$ for simplicity.

Figure 6:
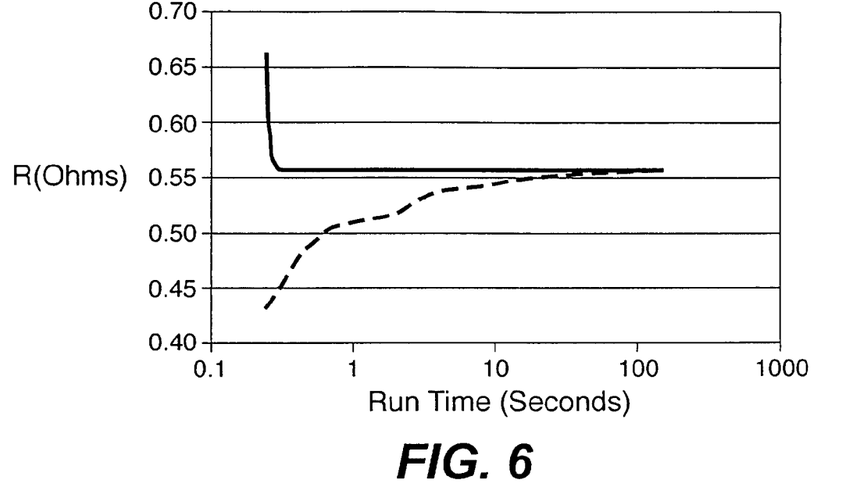
FIG. 6 is a diagram schematically illustrating the result of variational resistance calculation (versus the run time with $R_s=1$) in accordance with one embodiment of the present invention, compared with a conventional field solver computation.

FIG. 6 schematically illustrates the result of variational resistance calculation (versus the run time with $R_s = 1$) in accordance with one embodiment of the present invention, compared with a conventional field solver (Raphael) computation. Both codes are run on a 450 MHz dual processor Ultra-Sparc II, available from Sun Microsystems, Inc., Santa Clara, Calif. The Raphael RC2 solver is used. The variational code (referred to as "Varres") is implemented in Matlab®, available from The MathWorks, Inc., Natick, Mass. In FIG. 6, the solid line indicates the resistance of the hinge versus run time as calculated using the variational method (Varres) in accordance with one embodiment of the present invention. The dashed line indicates the resistance calculated using Raphael. The accuracy vs. run-time tradeoff is determined by the number of harmonics for Varres, and by the number of grid points for Raphael. As shown in FIG. 6, the variational code reaches its final value within 500 milliseconds while Raphael takes at least two orders of magnitude longer to achieve a comparable result. This might be due to the difficulties involved with meshing a corner adequately. The variational method has no problems with corners.

Figure 7:
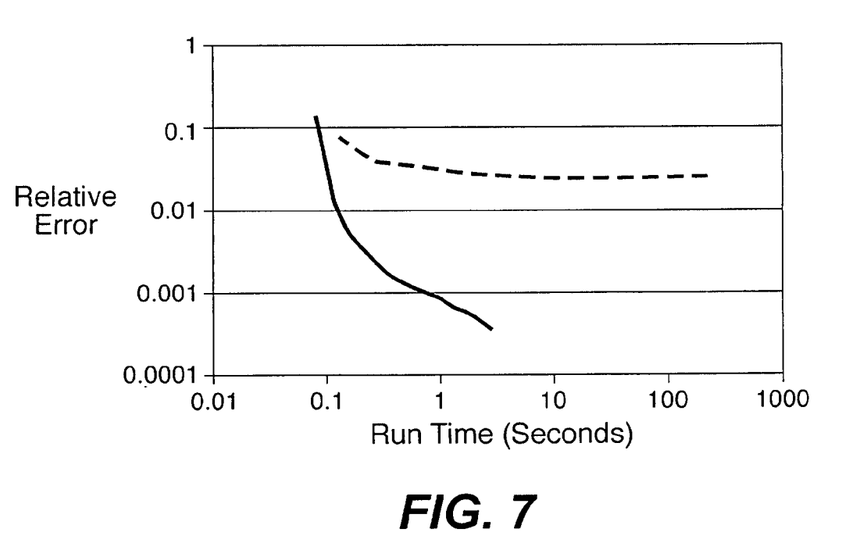
FIG. 7 is a diagram schematically illustrating an example of the resistance calculation for a slotted line in accordance with one embodiment of the present invention, compared with a conventional field solver computation.

FIG. 7 schematically illustrates an example of the resistance calculation for a slotted line such as one shown in FIG. 1A. It is assumed that the line is infinitely long and the calculation is performed for one section. In this specific case, there is an analytic solution obtained by using conformal transformations. In FIG. 7, instead of the calculated resistance, the relative error with respect to the analytic solution vs. run time is plotted so as to illustrate the accuracy and effectiveness of the variational method. Similarly to FIG. 6, the result of Varres is indicated by the solid line, and that of Raphael is indicated by the dashed line. Again, Varres (solid line) achieves accuracies comparable to Raphael in much less time. Moreover, the variational method can realize accuracies that Raphael cannot. For example, Varres reaches the accuracy with less than 0.1% error in about one second, while Raphael never achieves better than the accuracy with 2% error. This might be due to problems with field gradients at corners.

Figure 8:
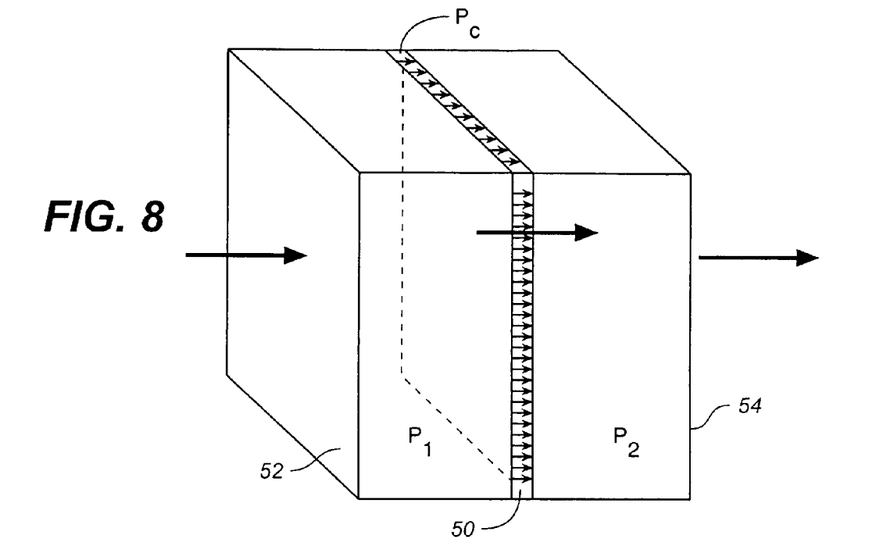
FIG. 8 is a diagram schematically illustrating a conductor system including at least one resistive boundary face having a contact resistance.

In accordance with one embodiment of the present invention, contact resistance of a conductor system is also considered. FIG. 8 schematically illustrates contact resistance associated with a boundary plane 50 between two conductors 52 and 54. The power $P_c$ dissipated by a resistive boundary can be calculated using the following formula:

$$P_c = \rho_c \int_A J_n^2 dS, \quad (15)$$

where A is the surface of the boundary plane and $J_n$ is the current density normal to the surface A. The contact resistivity, $\rho_c$, has units of Resistance-Area. Let us suppose, for example, the contact resistance is associated with the x=0 boundary of the rectangle in FIG. 3. The form of Jn given by Equations (5) and (7) is repeated here $$J_x = \frac{1}{hl} \sum_{n=0}^{N} A_n \cos(\beta_n y). \quad (16)$$

Substitution of Equation (16) into Equation (15) yields $$P_c = \frac{\rho_c}{hl} \left[ A_0^2 + \frac{1}{2} \sum_{n=1}^{N} A_n^2 \right]. \quad (17)$$

The expressions that multiply the unknown coefficients, $A_n$, are added to the proper elements of the H matrix. There are analogous expressions for the other sides of the rectangle. The total power dissipated by the conductor system (two conductors 52 and 54 and the boundary 50 therebetween) is given as $P_1+P_2+P_c$, where $P_1$ and $P_2$ are the power dissipation for the first and second conductors 52 and 54, respectively.

Figure 9:
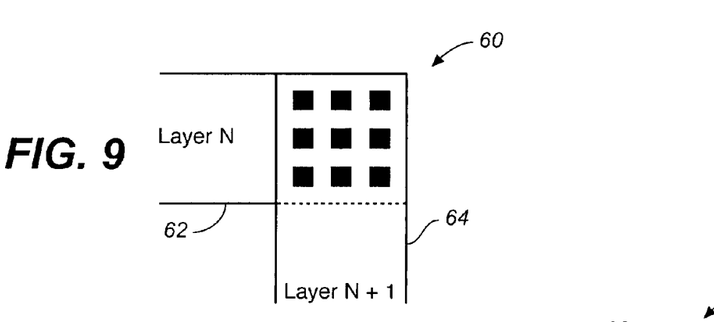
FIG. 9 is a diagram schematically illustrating a via array between two metal layers viewed from the top, as an example of a three-dimensional conductor system in accordance with one embodiment of the present invention.
Figure 10:
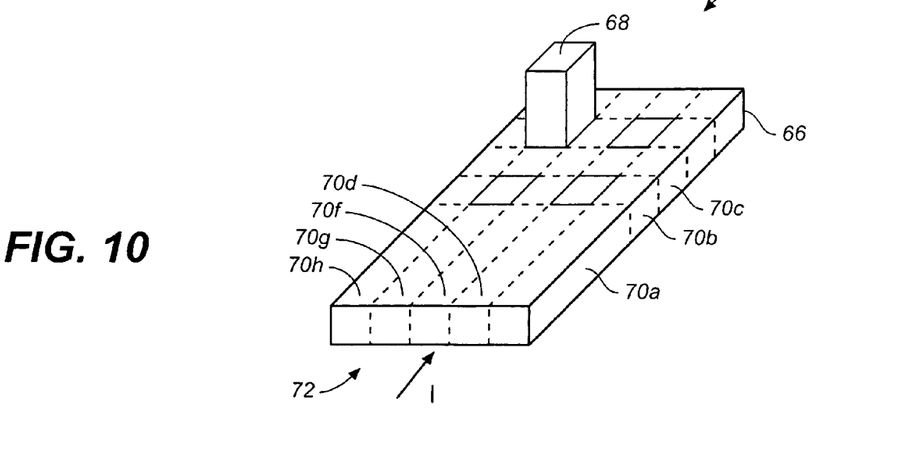
FIG. 10 is a diagram schematically illustrating a simplified perspective view of the lower metal layer and one of the vias shown in FIG. 9.

In accordance with one embodiment of the present invention, the variational method is expanded to three dimensions. For example, there are cases where a wide line must change its direction by 90° to distribute signal or power between certain circuit elements. This is accomplished by going up or down to the neighboring metal layer through an array of vias. FIG. 9 schematically illustrates an example of via array 60 between two metal layers 62 and 64 viewed from the top. The vias are shown as black squares in FIG. 9. FIG. 10 schematically illustrates a simplified perspective view of the lower metal layer 66 and one of the vias 68 shown in FIG. 9.

Figure 11:
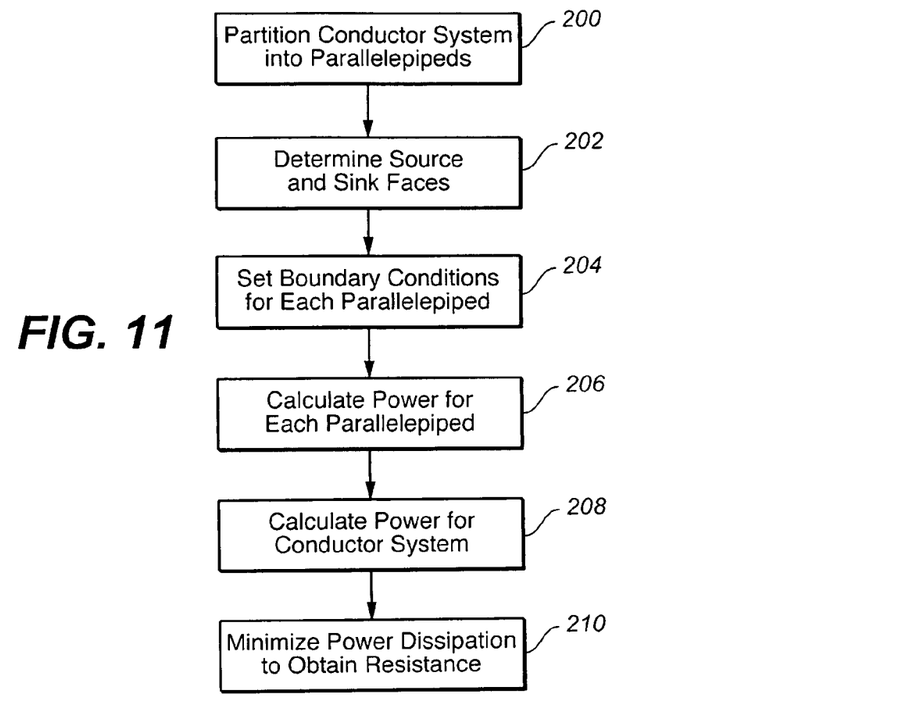
FIG. 11 is a process flow diagram schematically illustrating a method for calculating resistance of a three-dimensional conductor system for an integrated circuit design, in accordance with one embodiment of the present invention.

One question that arises in this example is how the resistance varies as the number of vias, M, changes. Typically, it is assumed that the resistance varies as 1/M. The entire assemblage, which includes the two line segments and the vias, is inherently three-dimensional and complicated, and thus its resistance is difficult or impossible to calculate using a traditional field solver. FIG. 11 schematically illustrates a method for calculating resistance of a three-dimensional conductor system for an integrated circuit design, for example, the two via-connected metal layers shown in FIGS. 9 and 10. The embodiment is explained referring to FIGS. 10 and 11.

The conductor system has a three-dimensional shape defined by boundary faces. In accordance with one embodiment of the present invention, the conductor system is partitioned into a plurality of parallelepipeds (200). For example, as shown in FIG. 10, the conductor system 69 is partitioned into a plurality of parallelepipeds 70 (70a, 70b, 70c, ... ). A boundary between two parallelepipeds 70 forms an entire face for both of the two parallelepipeds. It should be noted that although the conductor system 69 in FIG. 10 is illustrated as a metal layer and vias, the conductor system may further include additional conductor layer(s) and/or other conductor elements, as shown in FIG. 9.

First, at least one source face and at least one sink face are determined from among the boundary faces (202). As shown in FIG. 10, for example, a current I enters the conductor system through the source face 72 and leaves the conductor system through the sink face (not shown) in the adjacent layer. The source face 72 is actually a combined surface made up with the corresponding faces of parallelepipeds 70a, 70d, 70e, 70f, 70g, and 70h, as shown in FIG. 10. Boundary conditions are set with respect to the current for each of the parallelepipeds 70 (204). For example, similarly to the two-dimensional case, Neumann boundary conditions are set for the boundary faces other than the source and sink faces, using current continuity conditions for internal boundaries between the parallelepipeds 70. The power for each of the parallelepipeds 70 is calculated with the boundary conditions (206), for example, using Laplace's equation, as described above.

The power for the conductor system 69 is calculated based on the power and the boundary conditions of each of the parallelepipeds 70 (208). For example, as described above, an electric potential of each of the parallelepiped may be expressed as a Fourier series, and constraints are calculated based on current continuity within each of the parallelepipeds in terms of Fourier coefficients. The power of each of the parallelepipeds is summed up to obtain a total power dissipation of the conductor system, and then constraints for the conductor system are calculated based on the current continuity between the parallelepipeds in terms of the Fourier coefficients. Then, dissipation of the calculated power of the conductor system is minimized so as to obtain the resistance of the conductor system 69 (210). In obtaining the resistance, the Fourier coefficients are determined so as to minimize the total power dissipation of the conductor system, and the minimized power is divided by a square of the current entering the conductor system to yield the resistance. The resistance may be approximated by using at least one Fourier coefficient selected in the increasing order from the lowest order. When approximating the resistance, the accuracy of the approximated resistance value may be determined, and the calculation of the resistance may be iteratively repeated using an increased number of Fourier coefficients until achieving a desired accuracy of the approximated resistance value. In case where the conductor system includes at least one resistive boundary face having a contact resistance, as shown in FIG. 8, the power dissipated by the resistive boundary face is also added to the calculation of the total power dissipation of the conductor system. For example, the boundary face between the metal layer and each via may have a contact resistance.

Figure 12:
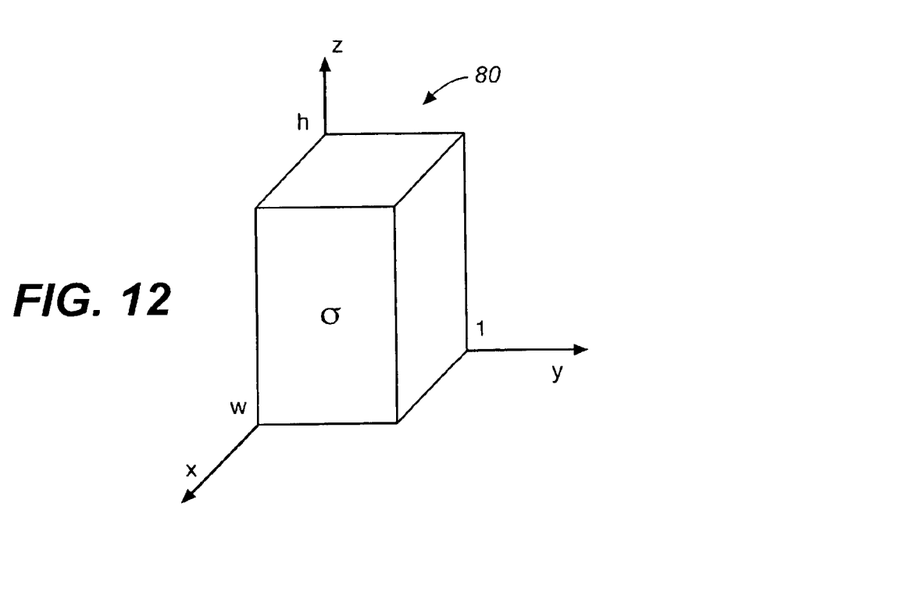
FIG. 12 is a diagram schematically illustrating a basic building block (parallelepiped) for the variational resistance calculation in accordance with one embodiment of the present invention.
Figure 13:
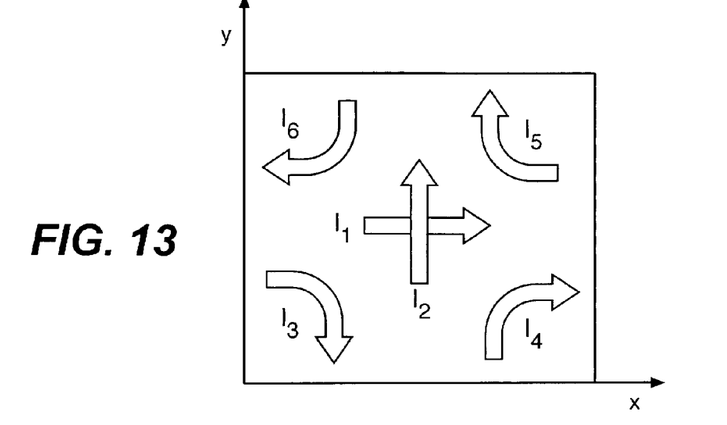
FIGS. 13-15 are diagrams schematically illustrating the 15 possible net currents in an x-y cross-section, y-z cross-section, and z-x cross-section, respectively, of a three-dimensional block shown in FIG. 12.
Figure 14:
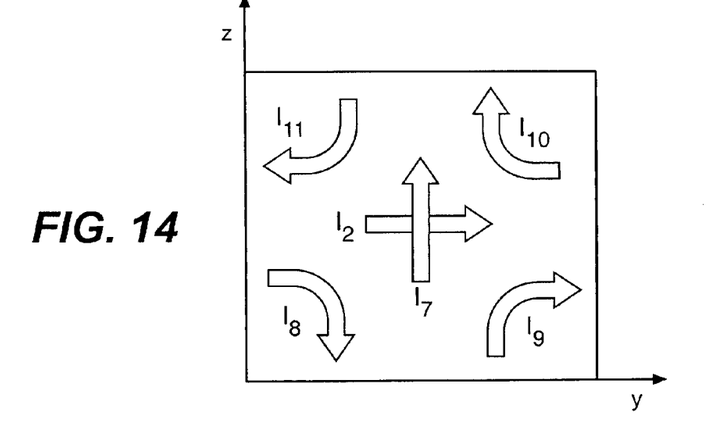
Figure 15:
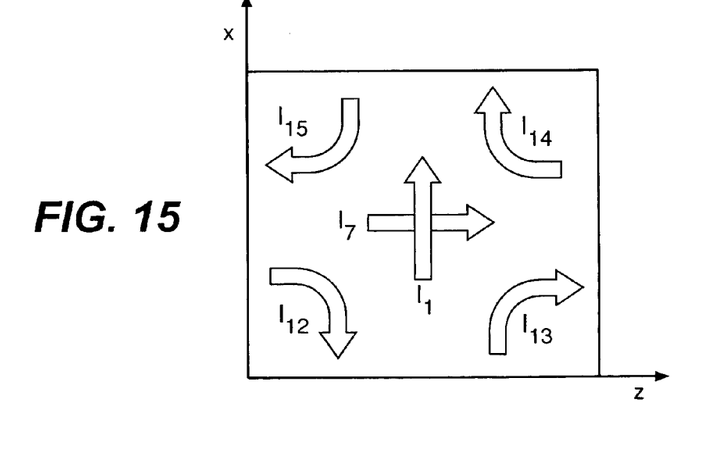

Details of the transition from two dimensions to three dimensions in accordance with one embodiment of the present invention are described below. The basic building block changes from a rectangle (FIG. 3) to a parallelepiped (block) 80 as shown in FIG. 12. The parallelepiped 80 has the width w, length l, and height h. Conductivity $\sigma$ is uniform throughout the parallelepiped 80. Four one-dimensional sides become six two-dimensional faces. Each Fourier coefficient now has two indices rather than one. The only terms that carry net current across boundaries are denoted by "00". FIGS. 13–15 schematically illustrate the 15 possible net currents in an x-y cross-section, y-z cross-section, and z-x cross-section, respectively, of a three-dimensional block. FIGS. 13–15 also show the labeling convention used for the six faces. As in the two-dimensional case, these currents add at the boundary faces to form the net currents into the volume, and expressed as follows:

$$A_{00} = I_1 + I_3 - I_6 - I_{12} + I_{13}$$

$$B_{00} = -I_1 - I_4 + I_5 - I_{14} + I_{15}$$

$$C_{00} = I_2 - I_3 + I_4 + I_8 - I_{11}$$

$$D_{00} = -I_2 - I_5 + I_6 - I_9 + I_{10}$$

$$E_{00} = I_7 - I_8 + I_9 + I_{12} - I_{15}$$

$$F_{00} = -I_7 - I_{10} + I_{11} - I_{13} + I_{14} \tag{18}$$

The extension of the potential $\Phi$ to three-dimensions is fairly straightforward, and the first three equations are the eigenvalues in the x, y, and z directions, and expressed as follows:

$$\alpha_n = \frac{n\pi}{w}$$

$$\beta_n = \frac{n\pi}{l} \tag{19}$$

$$\gamma_n = \frac{n\pi}{h}.$$

These next three equations are used to simplify the expressions for the potential and power.

$$\alpha_{mn}^2 = \beta_m^2 + \gamma_n^2 \tag{20}$$

$$\beta_{mn}^2 = \gamma_m^2 + \alpha_n^2$$

$$\gamma_{mn}^2 = \alpha_m^2 + \beta_n^2$$

The potential in three-dimensions is similar to that in two-dimensions, but much more complicated. As noted before, there are 15 net currents instead of 6, and many terms are double sums. It has been found that it is convenient to separate the terms where one of the Fourier indices is zero from those where neither index is zero. Although this almost triples the number of series, it has several advantages: (a) All series indices start from unity, eliminating a potential source of confusion; (b) When integrated to calculate power, there are factor-of-2 differences; and (c) Net currents are isolated. The potential $\Phi$ is expressed as follows:

$$\Phi = -\frac{I_1}{\sigma l h} x - \frac{I_2}{\sigma h w} y - \frac{I_7}{\sigma w l} z - \tag{21}$$

$$\frac{1}{2\sigma w l h}[(w-x)^2(-I_3 + I_6 + I_{12} - I_{13})] -$$

$$\frac{1}{2\sigma w l h}[x^2(I_4 - I_5 + I_{14} - I_{15})] -$$

$$\frac{1}{2\sigma w l h}[(l-y)^2(I_3 - I_4 - I_8 + I_{11})] -$$

$$\frac{1}{2\sigma w l h}[y^2(I_5 - I_6 + I_9 - I_{10})] -$$

$$\frac{1}{2\sigma w l h}[(h-z)^2(I_8 - I_9 - I_{12} + I_{15})] -$$

$$\frac{1}{2\sigma w l h}[z^2(I_{10} - I_{11} + I_{13} - I_{14})] +$$

$$\frac{1}{\sigma l h}\sum_{m,n}\frac{A_{mn}\cosh(\alpha_{mn}w - \alpha_{mn}x) + B_{mn}\cosh(\alpha_{mn}x)}{\alpha_{mn}\sinh(\alpha_{mn}w)}\cos(\beta_m y)\cos(\gamma_n z) +$$

$$\frac{1}{\sigma l h}\sum_{m}\frac{A_{m0}\cosh(\beta_m w - \beta_m x) + B_{m0}\cosh(\beta_m x)}{\beta_m \sinh(\beta_m w)}\cos(\beta_m y) +$$

$$\frac{1}{\sigma l h}\sum_{n}\frac{A_{0n}\cosh(\gamma_n w - \gamma_n x) + B_{0n}\cosh(\gamma_n x)}{\gamma_n \sinh(\gamma_n w)}\cos(\gamma_n z) +$$

$$\frac{1}{\sigma h w}\sum_{m,n}\frac{C_{mn}\cosh(\beta_{mn}l - \beta_{mn}y) + D_{mn}\cosh(\beta_{mn}y)}{\beta_{mn}\sinh(\beta_{mn}l)}\cos(\gamma_m z)\cos(\alpha_n x) +$$

$$\frac{1}{\sigma h w}\sum_{m}\frac{C_{m0}\cosh(\gamma_m l - \gamma_m y) + D_{m0}\cosh(\gamma_m y)}{\gamma_m \sinh(\gamma_m l)}\cos(\gamma_m z) +$$

$$\frac{1}{\sigma h w}\sum_{n}\frac{C_{0n}\cosh(\alpha_n l - \alpha_n y) + D_{0n}\cosh(\alpha_n y)}{\alpha_n \sinh(\alpha_n l)}\cos(\alpha_n x) +$$

$$\frac{1}{\sigma w l}\sum_{m,n}\frac{E_{mn}\cosh(\gamma_{mn}h - \gamma_{mn}z) + F_{mn}\cosh(\gamma_{mn}z)}{\gamma_{mn}\sinh(\gamma_{mn}h)}\cos(\alpha_m x)\cos(\beta_n y) +$$

-continued $$\frac{1}{\sigma w l}\sum_m \frac{E_{m0}\cosh(\alpha_m h-\alpha_m z)+F_{m0}\cosh(\alpha_m z)}{\alpha_m \sinh(\alpha_m h)}\cos(\alpha_m x)+$$

$$\frac{1}{\sigma w l}\sum_n \frac{E_{0n}\cosh(\beta_n h-\beta_n z)+F_{0n}\cosh(\beta_n z)}{\beta_n \sinh(\beta_n h)}\cos(\beta_n y).$$

By integrating over the volume, the power P is expressed as follows:

$$P = \frac{w}{3\sigma l h}(A_{00}^2 - A_{00}B_{00} + B_{00}^2) + \quad (22)$$

$$\frac{l}{3\sigma h w}(C_{00}^2 - C_{00}D_{00} + D_{00}^2) +$$

$$\frac{h}{3\sigma w l}(E_{00}^2 - E_{00}F_{00} + F_{00}^2) +$$

$$\frac{2w}{\sigma l h}\sum_n \frac{1}{(n\pi)^2}[A_{00}+(-1)^n B_{00}]$$

$$[C_{0n}+D_{0n}+E_{n0}+F_{n0}]+$$

$$\frac{2l}{\sigma h w}\sum_n \frac{1}{(n\pi)^2}[C_{00}+(-1)^n D_{00}]$$

$$[E_{0n}+F_{0n}+A_{n0}+B_{n0}]+$$

$$\frac{2h}{\sigma w l}\sum_n \frac{1}{(n\pi)^2}[E_{00}+(-1)^n F_{00}]$$

$$[A_{0n}+B_{0n}+C_{n0}+D_{n0}]+$$

$$\frac{w}{4\sigma l h}\sum_{m,n}\frac{1}{\alpha_{mn}w}\left[\frac{A_{mn}^2+B_{mn}^2}{\tanh(\alpha_{mn}w)}+\frac{2A_{mn}B_{mn}}{\sinh(\alpha_{mn}w)}\right]+$$

$$\frac{w}{2\sigma l h}\sum_m \frac{1}{\beta_m w}\left[\frac{A_{m0}^2+B_{m0}^2}{\tanh(\beta_m w)}+\frac{2A_{m0}B_{m0}}{\sinh(\beta_m w)}\right]+$$

$$\frac{w}{2\sigma l h}\sum_n \frac{1}{\gamma_n w}\left[\frac{A_{0n}^2+B_{0n}^2}{\tanh(\gamma_n w)}+\frac{2A_{0n}B_{0n}}{\sinh(\gamma_n w)}\right]+$$

$$\frac{l}{4\sigma h w}\sum_{m,n}\frac{1}{\beta_{mn}l}\left[\frac{C_{mn}^2+D_{mn}^2}{\tanh(\beta_{mn}l)}+\frac{2C_{mn}D_{mn}}{\sinh(\beta_{mn}l)}\right]+$$

$$\frac{l}{2\sigma h w}\sum_m \frac{1}{\gamma_m l}\left[\frac{C_{m0}^2+D_{m0}^2}{\tanh(\gamma_m l)}+\frac{2C_{m0}D_{m0}}{\sinh(\gamma_m l)}\right]+$$

$$\frac{l}{2\sigma h w}\sum_n \frac{1}{\alpha_n l}\left[\frac{C_{0n}^2+D_{0n}^2}{\tanh(\alpha_n l)}+\frac{2C_{0n}D_{0n}}{\sinh(\alpha_n l)}\right]+$$

$$\frac{h}{4\sigma w l}\sum_{m,n}\frac{1}{\gamma_{mn}h}\left[\frac{E_{mn}^2+F_{mn}^2}{\tanh(\gamma_{mn}h)}+\frac{2E_{mn}F_{mn}}{\sinh(\gamma_{mn}h)}\right]+$$

$$\frac{h}{2\sigma w l}\sum_m \frac{1}{\alpha_m h}\left[\frac{E_{m0}^2+F_{m0}^2}{\tanh(\alpha_m h)}+\frac{2E_{m0}F_{m0}}{\sinh(\alpha_m h)}\right]+$$

$$\frac{h}{2\sigma w l}\sum_n \frac{1}{\beta_n h}\left[\frac{E_{0n}^2+F_{0n}^2}{\tanh(\beta_n h)}+\frac{2E_{0n}F_{0n}}{\sinh(\beta_n h)}\right]+$$

$$\frac{1}{\sigma w l h}\sum_{i,m,n}\frac{1}{\alpha_n^2+\beta_i^2+\gamma_m^2}[A_{im}+(-1)^n B_{im}]$$

$$[C_{mn}+(-1)^i D_{mn}]+$$

-continued $$\frac{2}{\sigma w l h}\sum_{i,n}\frac{1}{\alpha_n^2+\beta_i^2}[A_{i0}+(-1)^n B_{i0}]$$

$$[C_{0n}+(-1)^i D_{0n}]+$$

$$\frac{1}{\sigma w l h}\sum_{i,m}\frac{1}{\beta_i^2+\gamma_m^2}[A_{im}+B_{im}][C_{m0}+(-1)^i D_{m0}]+$$

$$\frac{1}{\sigma w l h}\sum_{m,n}\frac{1}{\alpha_n^2+\gamma_m^2}[A_{0m}+(-1)^n B_{0m}][C_{mn}+D_{mn}]+$$

$$\frac{1}{\sigma w l h}\sum_m \frac{1}{\gamma_m^2}[A_{0m}+B_{0m}][C_{m0}+D_{m0}]+$$

$$\frac{1}{\sigma w l h}\sum_{i,m,n}\frac{1}{\alpha_m^2+\beta_n^2+\gamma_i^2}[C_{im}+(-1)^n D_{im}]$$

$$[E_{mn}+(-1)^i F_{mn}]+$$

$$\frac{2}{\sigma w l h}\sum_{i,n}\frac{1}{\beta_n^2+\gamma_i^2}[C_{i0}+(-1)^n D_{i0}][E_{0n}+(-1)^i F_{0n}]+$$

$$\frac{1}{\sigma w l h}\sum_{i,m}\frac{1}{\alpha_m^2+\gamma_i^2}[C_{im}+D_{im}][E_{m0}+(-1)^i F_{m0}]+$$

$$\frac{1}{\sigma w l h}\sum_{m,n}\frac{1}{\alpha_m^2+\beta_n^2}[C_{0m}+(-1)^n D_{0m}][E_{mn}+F_{mn}]+$$

$$\frac{1}{\sigma w l h}\sum_m \frac{1}{\alpha_m^2}[C_{0m}+D_{0m}][E_{m0}+F_{m0}]+$$

$$\frac{1}{\sigma w l h}\sum_{i,m,n}\frac{1}{\alpha_i^2+\beta_m^2+\gamma_n^2}[E_{im}+(-1)^n F_{im}]$$

$$[A_{mn}+(-1)^i B_{mn}]+$$

$$\frac{2}{\sigma w l h}\sum_{i,n}\frac{1}{\alpha_i^2+\gamma_n^2}[E_{i0}+(-1)^n F_{i0}][A_{0n}+(-1)^i B_{0n}]+$$

$$\frac{1}{\sigma w l h}\sum_{i,m}\frac{1}{\alpha_i^2+\beta_m^2}[E_{im}+F_{im}][A_{m0}+(-1)^i B_{m0}]+$$

$$\frac{1}{\sigma w l h}\sum_{m,n}\frac{1}{\beta_m^2+\gamma_n^2}[E_{0m}+(-1)^n F_{0m}][A_{mn}+B_{mn}]+$$

$$\frac{1}{\sigma w l h}\sum_m \frac{1}{\beta_m^2}[E_{0m}+F_{0m}][A_{m0}+B_{m0}]+$$

$$R_A\left[A_{00}^2+\frac{1}{4}\sum_{m,n}A_{mn}^2+\frac{1}{2}\sum_m A_{m0}^2+\frac{1}{2}\sum_n A_{0n}^2\right]+$$

$$R_B\left[B_{00}^2+\frac{1}{4}\sum_{m,n}B_{mn}^2+\frac{1}{2}\sum_m B_{m0}^2+\frac{1}{2}\sum_n B_{0n}^2\right]+$$

$$R_C\left[C_{00}^2+\frac{1}{4}\sum_{m,n}C_{mn}^2+\frac{1}{2}\sum_m C_{m0}^2+\frac{1}{2}\sum_n C_{0n}^2\right]+$$

$$R_D\left[D_{00}^2+\frac{1}{4}\sum_{m,n}D_{mn}^2+\frac{1}{2}\sum_m D_{m0}^2+\frac{1}{2}\sum_n D_{0n}^2\right]+$$

$$R_E\left[E_{00}^2+\frac{1}{4}\sum_{m,n}E_{mn}^2+\frac{1}{2}\sum_m E_{m0}^2+\frac{1}{2}\sum_n E_{0n}^2\right]+$$

$$R_F\left[F_{00}^2+\frac{1}{4}\sum_{m,n}F_{mn}^2+\frac{1}{2}\sum_m F_{m0}^2+\frac{1}{2}\sum_n F_{0n}^2\right]$$

In Equation (22), the first three terms are due to net current. The next three terms are from net current-harmonic current cross products. The nine terms after that are power from harmonic currents runnijng straight across the volume. The next 15 terms are due to harmonic currents that turn corners. The last six are power from contact resistance. Although the potential and power expressions are long and complicated, the constraints and solution are the sane as for the two dimensional case.

Figure 16:
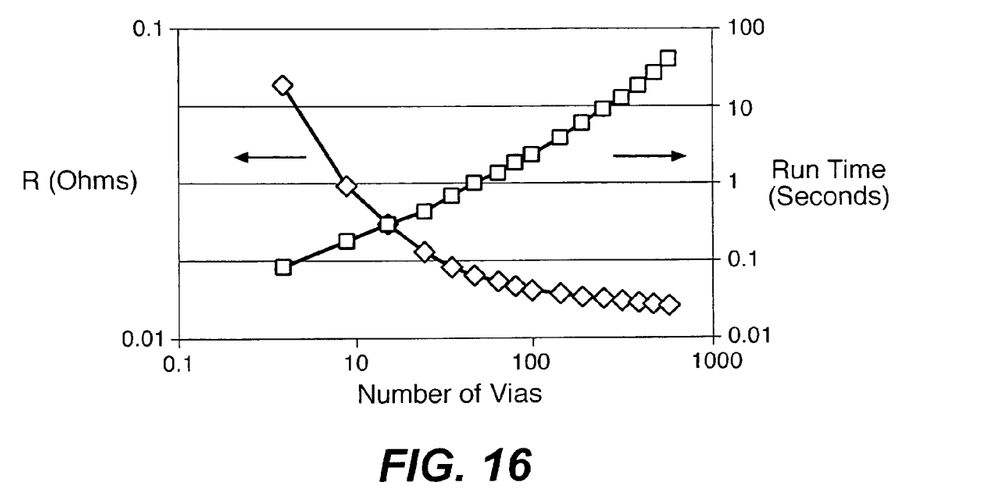
FIG. 16 is a diagram schematically illustrating the result of resistance calculation for a conductor structure with square via arrays in accordance with one embodiment of the present invention.

FIG. 16 schematically illustrates the result of resistance calculation for such a conductor structure with square via arrays (as shown in FIG. 9) with different numbers of vias. In this example, the top and bottom lines (metal layers 62 and 64) are 50μ wide and 1μ thick. The vias 60 are 1μ cubes that are arrayed in a square 48μ on a side. The space between vias decreases as the number of vias increase. The entire system is assumed to be made of aluminum. Given these dimensions and conditions, it is shown that the resistance does not exhibit the expected 1/M characteristics or any other power-law behavior. In FIG. 16, curve 80 represents the resistance (versus the number of vias) and curve 82 represents the run time. The total number of regions in the system scales with the number of vias. The run time increases as the square of the number of regions. A single harmonic was used to calculate the results in FIG. 16. A more accurate calculation using Varres shows that these numbers to have an error of about 10%.

While the embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for calculating resistance of a conductor system for an integrated circuit design, the conductor system having a three-dimensional shape defined by boundary faces, said method comprising:

partitioning the three-dimensional shape into a plurality of parallelepipeds, a boundary between two parallelepipeds forms an entire face for both of the two parallelepipeds;

determining at least one source face and at least one sink face from among the boundary faces, a current entering the conductor system through the source face and leaving the conductor system through the sink face;

setting boundary conditions with respect to the current for each of the parallelepipeds;

calculating power for each of the parallelepipeds with the boundary conditions;

calculating power for the conductor system based on the power and the boundary conditions of each of the parallelepipeds; and obtaining the resistance of the conductor system by minimizing dissipation of the calculated power of the conductor system.

2. The method in accordance with claim 1, wherein said setting includes:

setting Neumann boundary conditions for the boundary faces other than the source and sink faces.

3. The method in accordance with claim 2, wherein said setting further includes:

setting current continuity conditions for internal boundaries between the parallelepipeds.

4. The method in accordance with claim 1, wherein said calculating power for each of the parallelepipeds includes:

using Laplace's equation.

5. The method in accordance with claim 1, further comprising:

expressing an electric potential of each of the parallelepiped as a Fourier series.

6. The method in accordance with claim 5, wherein said calculating the power of each of the parallelepipeds includes:

calculating constraints based on current continuity within each of the parallelepipeds in terms of Fourier coefficients.

7. The method in accordance with claim 6, wherein said calculating the power of the conductor system further includes:

summing the power of each of the parallelepipeds to obtain a total power dissipation of the conductor system; and calculating constraints based on the current continuity between the parallelepipeds in terms of the Fourier coefficients.

8. The method in accordance with claim 7, wherein the conductor system includes at least one resistive boundary face having a contact resistance, said method further comprising:

calculating power dissipated by the resistive boundary face; and adding the calculated power dissipation by the resistive boundary face when obtaining the total power dissipation of the conductor system.

9. The method in accordance with claim 7, wherein said obtaining includes:

determining the Fourier coefficients so as to minimize the total power dissipation of the conductor system; and dividing the minimized power by a square of the current entering the conductor system to yield the resistance.

10. The method in accordance with claim 9, wherein said obtaining further includes:

approximating the resistance by using at least one Fourier coefficient selected in an increasing order from a lowest order.

11. The method in accordance with claim 10, further comprising:

determining accuracy of the approximated resistance value; and iteratively repeating the approximating of the resistance using an increased number of Fourier coefficients until achieving a desired accuracy of the approximated resistance value.

12. An apparatus for calculating resistance of a conductor system for an integrated circuit design, the conductor system having a three-dimensional shape defined by boundary faces, said apparatus comprising:

means for partitioning the three-dimensional shape into a plurality of parallelepipeds, a boundary between two parallelepipeds forms an entire face for both of the two parallelepipeds;

means for determining a source face and a sink face from among the boundary faces, a current entering the conductor system through the source face and leaving the conductor system through the sink face;

means for setting boundary conditions with respect to the current for each of the parallelepipeds;

means for calculating power for each of the parallelepipeds with the boundary conditions;

means for calculating power for the conductor system based on the power and the boundary conditions of each of the parallelepipeds; and means for obtaining the resistance of the conductor system by minimizing dissipation of the calculated power of the conductor system.

13. The apparatus in accordance with claim 12, wherein said means for setting includes:

means for setting Neumann boundary conditions for the boundary faces other than the source and sink faces.

14. The apparatus in accordance with claim 13, wherein said means for setting further includes:

means for setting current continuity conditions for internal boundaries between the parallelepipeds.

15. The apparatus in accordance with claim 12, wherein said means for calculating power for each of the parallelepipeds includes:

means for using Laplace's equation.

16. The apparatus in accordance with claim 12, further comprising:

means for expressing an electric potential of each of the parallelepiped as a Fourier series.

17. The apparatus in accordance with claim 16, wherein said means for calculating the power of each of the parallelepipeds includes:

means for calculating constraints based on current continuity within each of the parallelepipeds in terms of Fourier coefficients.

18. The apparatus in accordance with claim 17, wherein said means for calculating the power of the conductor system further includes:

means for summing the power of each of the parallelepipeds to obtain a total power dissipation of the conductor system; and means for calculating constraints based on the current continuity between the parallelepipeds in terms of the Fourier coefficients.

19. The apparatus in accordance with claim 18, wherein the conductor system includes at least one resistive boundary face having a contact resistance, said apparatus further comprising:

means for calculating power dissipated by the resistive boundary face; and means for adding the calculated power dissipation by the resistive boundary face when obtaining the total power dissipation of the conductor system.

20. The apparatus in accordance with claim 18, wherein said means for obtaining includes:

means for determining the Fourier coefficients so as to minimize the total power dissipation of the conductor system; and means for dividing the minimized power by a square of the current entering the conductor system to yield the resistance.

21. The apparatus in accordance with claim 20, wherein said means for obtaining further includes:

means for approximating the resistance by using at least one Fourier coefficient selected in an increasing order from a lowest order.

22. The apparatus in accordance with claim 21, further comprising:

means for determining accuracy of the approximated resistance value; and means for iteratively repeating the approximating of the resistance using an increased number of Fourier coefficients until achieving a desired accuracy of the approximated resistance value.

23. A program storage device readable by a machine, tangibly embodying a program of instructions executable by the machine to perform a method for calculating resistance of a conductor system for an integrated circuit design, the conductor system having a three-dimensional shape defined by boundary faces, the method comprising:

partitioning the three-dimensional shape into a plurality of parallelepipeds, a boundary between two parallelepipeds forms an entire face for both of the two parallelepipeds;

determining a source face and a sink face from among the boundary faces, a current entering the conductor system through the source face and leaving the conductor system through the sink face;

setting boundary conditions with respect to the current for each of the parallelepipeds;

calculating power for each of the parallelepipeds with the boundary conditions;

calculating power for the conductor system based on the power and the boundary conditions of each of the parallelepipeds; and obtaining the resistance of the conductor system by minimizing dissipation of the calculated power of the conductor system.

* * * * *